US009214934B2

(12) United States Patent
Cottell

(10) Patent No.: US 9,214,934 B2
(45) Date of Patent: Dec. 15, 2015

(54) DESATURATION DETECTION CIRCUIT FOR USE BETWEEN THE DESATURATION DETECTION INPUT OF AN OPTOCOUPLER AND THE OUTPUT OF A POWER SWITCHING DEVICE

(71) Applicant: Control Techniques Limited, Newtown (GB)

(72) Inventor: Robert Anthony Cottell, Montgomery (GB)

(73) Assignee: CONTROL TECHNIQUES LIMITED, Newtown (GB)

( * ) Notice: Subject to any disclaimer, the term of this patent is extended or adjusted under 35 U.S.C. 154(b) by 33 days.

(21) Appl. No.: 14/159,945

(22) Filed: Jan. 21, 2014

(65) Prior Publication Data
US 2014/0203843 A1    Jul. 24, 2014

(30) Foreign Application Priority Data
Jan. 22, 2013  (GB) .................................. 1301104.4

(51) Int. Cl.
H03K 17/04    (2006.01)
H03K 17/78    (2006.01)
H03K 17/082   (2006.01)

(52) U.S. Cl.
CPC ............ *H03K 17/78* (2013.01); *H03K 17/0826* (2013.01)

(58) Field of Classification Search
CPC .................... H03K 17/0422; H03K 17/04126; H03K 5/02; H03K 17/567; H03K 17/64

USPC .......................... 327/375, 432, 389; 361/93.1
See application file for complete search history.

(56) References Cited

U.S. PATENT DOCUMENTS

| 6,859,087 | B2 | 2/2005 | Galli et al. |
| 7,760,005 | B2 | 7/2010 | de Rooij et al. |
| 7,768,337 | B2* | 8/2010 | Bayerer ........................ 327/389 |
| 2003/0067317 | A1* | 4/2003 | Dubhashi ...................... 324/763 |
| 2004/0120090 | A1* | 6/2004 | Galli et al. .................... 361/115 |
| 2012/0248864 | A1 | 10/2012 | Ioannidis et al. |

FOREIGN PATENT DOCUMENTS

GB           2433657          6/2007

* cited by examiner

*Primary Examiner* — Quan Tra
(74) *Attorney, Agent, or Firm* — Harness, Dickey & Pierce, P.L.C.

(57) ABSTRACT

A desaturation detection circuit for use between the desaturation detection input of an optocoupler and the output of a power switching device, the desaturation detection circuit comprising: a threshold setting element having an input and an output, the input for connection to the output of a power switching device via one or more diode(s), the threshold setting element being arranged to set a threshold voltage at the input at which the threshold setting element will provide an output at the output of the threshold setting element when the input voltage is exceeded, and a detector having an input connected to the output of the threshold setting element and an output connectable to a desaturation detection input of an optocoupler, the detector being arranged to detect an output at the output of the threshold setting element and in response to provide a control signal at the output of the detector for the desaturation detection input to trigger a desaturation routine in the optocoupler.

20 Claims, 2 Drawing Sheets

DESATURATION DETECTION CIRCUIT FOR USE BETWEEN THE DESATURATION DETECTION INPUT OF AN OPTOCOUPLER AND THE OUTPUT OF A POWER SWITCHING DEVICE

CROSS-REFERENCE TO RELATED APPLICATION

This application claims the benefit and priority of Great Britain Patent Application No. 1301104.4 filed Jan. 22, 2013. The entire disclosure of the above application is incorporated herein by reference.

FIELD

The disclosure relates to an electrically robust Vce sense interface to a gate drive optocoupler integrated circuit (IC) for a power transistor (e.g. an insulated gate bipolar transistor (IGBT)) which has a desaturation detect input and soft turn-off capability.

BACKGROUND

A hard short circuit arising in an inverter power circuit will cause the IGBT collector current to rise to abnormally high levels which results in the IGBT pulling out of the normal saturated condition.

Commercially available gate drive optocoupler ICs with desaturation (desat) detection and soft turn-off capability, such as the Avago ACPL331J, HCPL-316J and Renesas PS9402, have the disadvantage of an internally fixed threshold level for the Desat input which can be as low as 6.0V in some designs.

FIG. 1 shows a known optocoupler gate drive product with desaturation fault detection, the Avago ACPL-331J 10. The Avago ACPL-331J has a soft turn-off feature. The DESAT pin (pin 14) of the optocoupler 10 monitors the collector-emitter voltage Vce of an IGBT 20. When there is a short circuit and a very high current flow through the IGBT 20, the IGBT will go into desaturation mode and the collector-emitter voltage Vce of the IGBT will rise. A fault is detected by the optocoupler gate drive 10 once the voltage Vce goes above the internal desaturation fault detection threshold voltage of the IC. When a fault is detected by the DESAT pin (pin 14), a weak pull-down device in the output drive stage will turn on to "softly" turn off the IGBT and so prevent large di/dt induced voltages.

In a conventional design as shown in FIG. 1, diodes D1 and D2 (known as Vce sense diodes or DESAT diodes) are connected directly to the Desat input (pin 14) of the IC 10 via a resistor R2 which would have a typical/recommended value of 100Ω. A blanking time filter is defined by R1 and C1, typical values being 1 k to 4.7 kΩ and 1 n to 4.7 nF respectively to give a blanking time in the order of several microseconds. In some schemes C1 may be set as low as 100 pF and R1 omitted but this approach may lead to noise immunity issues in the design.

$V_E$ is the common voltage (e.g. nominally 0V) for the supply rails GD_V+ and GD_V−, and the $V_E$ connection to the IC (pin 16) connects to the emitter E of the IGBT 20.

A typical Vce saturation voltage, Vce sat, for an IGBT module operating at for example between 1.5 and 2 times rated current and at maximum rated operating temperature may exceed 3V. The saturation voltage may be higher if production spreads and internal voltage drops due to the module construction are taken into account.

The design headroom for the Desat input may be calculated as follows:

$$i_D = \frac{V_{OH} - (V_{D1} + V_{D2} + V_{CE\_sat})}{R1 + R2} \quad (1)$$

$V_{OH}$ is the output high voltage of the IC 10. $V_{D1}$ (and $V_{D2}$) is the on-state forward voltage of desaturation (DESAT) diode D1 (and second desaturation diode D2 if provided). These diodes are typically chosen to have a reverse voltage rating of at least 1000V however their forward voltage rating is often typically higher than a standard low voltage device. The desaturation diode may comprise one or more diodes. A string of DESAT diodes may be provided in series or a single DESAT diode may be provided.

If the IC output high voltage, $V_{OH}$, is 15V, the $V_{CE\_sat}$ voltage is 3V and R1 is chosen to be 1 kΩ, the design headroom for the Desat input may be calculated as follows:

$$i_D = \frac{15 - (0.8 + 0.8 + 3.0)}{1000 + 100} = 9.45 \text{ mA}$$

The desaturation voltage $V_{DESAT}$ may then be calculated as follows:

$$V_{DESAT} = V_{OH} - R1 \times I_D \quad (2)$$

$$V_{DESAT} = 15 - 1k \times 9.45 = 5.55 V$$

$$V_{Desat\_Headroom} = V_{DESAT\_Threshold\_Min} - V_{DESAT} \quad (3)$$

where $V_{DESAT\_Threshold\_Min}$ is the minimum internal threshold level fixed internally within the IC $$V_{Desat\_Headroom} = 6 - 5.55 = 0.45 V$$

From these calculations, the design headroom is shown to be less than 0.5V, or even lower if the maximum Vce sat for the IGBT under consideration is taken as high as 3.5V. This could lead to nuisance tripping of the IC and be a reliability issue to the inverter power circuit design.

Generally, a workable design value for the Vce threshold would be between 7 to 13V.

When the conventional circuit shown in FIG. 1 is implemented in a practical design some additional precautions may also be taken. For instance, the reverse recovery of the IGBT anti-parallel free wheel diode 30 can cause the Desat pin to be pulled transiently below ground (below the potential at $V_E$) and therefore forward bias the substrate diode of the IC. This affect could result in a false Fault signal being generated at pin 3 of the IC signal.

To minimize the disturbances, the design value of C1 needs to be considered carefully by balancing the requirements of noise suppression and blanking time.

Additionally, the Vce sense diodes D1 and D2 need to be fast recovery and have a small reverse capacitance to minimize the disturbance on the IC. A schottky diode D3 may be connected between the Desat pin (pin 14) and $V_E$ (pin 16) to prevent the forward biasing of the substrate diode from power circuit switching transients.

A zener diode D4 with a clamping value of around 8V may also be connected in parallel with D3 to prevent positive transients from affecting the Desat pin (pin 14).

The anti-parallel freewheel diode 30 can have a large instantaneous forward voltage transient which will exceed the normal forward voltage rating of the diode. This may present a negative transient at the Desat input (pin 14) which can cause current to be drawn out of the IC. To limit the current drawn, a resistor R2 is provided in series with D1 and D2, with a typical value of around 100 Ω.

SUMMARY

Aspects and features of the present disclosure are set out in the appended claims.

In one implementation, a desaturation detection circuit for use between the desaturation detection input of an optocoupler and the output of a power switching device, the desaturation detection circuit comprising: a threshold setting element having an input and an output, the input for connection to the output of a power switching device via one or more diode(s), the threshold setting element being arranged to set a threshold voltage at the input at which the threshold setting element will provide an output at the output of the threshold setting element when the input voltage is exceeded, and a detector having an input connected to the output of the threshold setting element and an output connectable to a desaturation detection input of an optocoupler, the detector being arranged to detect an output at the output of the threshold setting element and in response to provide a control signal at the output of the detector for the desaturation detection input to trigger a desaturation routine in the optocoupler.

In one embodiment, the output of the detector may be held below a level at which a desaturation routine in the optocoupler would be triggered until an output from the threshold setting element is detected. For instance, the output of the detector may be held at substantially a common voltage of the circuit until an output from the threshold setting element is detected or, for instance, the output of the detector may be held between (e.g. midway between) a common voltage and a level at which a desaturation routine in the optocoupler would be triggered until an output from the threshold setting element is detected.

The threshold setting element may comprise a first switching element arranged to be in the on state during desaturation operation of the power switching device until the output of the power switching device reaches the threshold voltage and the detector may comprise a second switching element arranged to be in an off state when the threshold setting element provides an output and arranged to provide the control signal for the desaturation input to the desaturation detection voltage when an output from the threshold setting element is provided.

A first resistor network may be provided to couple the first switching element to the output of the power switching device via at least one diode and a second resistor network may be provided to couple the second switching element to the optocoupler, the first and second switching elements holding the voltage at the output of the desaturation detection circuit at a voltage below the desaturation detection input of the optocoupler until the voltage of the output of the power switching device reaches the threshold voltage.

The first switching element and the second switching element may be in an on state when the power switching device is operating in normal saturated mode and in an off state when the power switching device is operating out of saturation or is in an off state.

The power switching device may be an insulated gate bipolar transistor having a collector, an emitter and a gate, the input of the threshold setting element being for connection to the collector of the insulated gate bipolar transistor via at least one diode. The output of the optocoupler is connected to the gate of the insulated gate bipolar transistor.

There is also provided a circuit comprising: a power switching device, an optocoupler having a desaturation detection input to detect desaturation and an output, the output coupled to the power switching device to provide a control signal to the power switching device; and a desaturation detection circuit as described.

In an embodiment, a method of operating a desaturation detection circuit comprises: monitoring the voltage input to the desaturation detection circuit, determining whether the voltage input to the desaturation detection circuit is greater than or equal to a threshold voltage above a desaturation voltage, and when the voltage input to the desaturation detection circuit is greater than or equal to a threshold voltage above a desaturation voltage, outputting a control signal to trigger a desaturation routine.

The output of the desaturation detection circuit may be held below a level at which a desaturation routine in the optocoupler would be triggered until the control signal is outputted, for instance at substantially a common voltage of the circuit or between (e.g. midway between) a common voltage and a level at which a desaturation routine in the optocoupler would be triggered until the control signal is outputted.

DRAWINGS

The technique will now be described further, by way of example only, with reference to the accompanying drawings in which.

DETAILED DESCRIPTION

Figure 1:
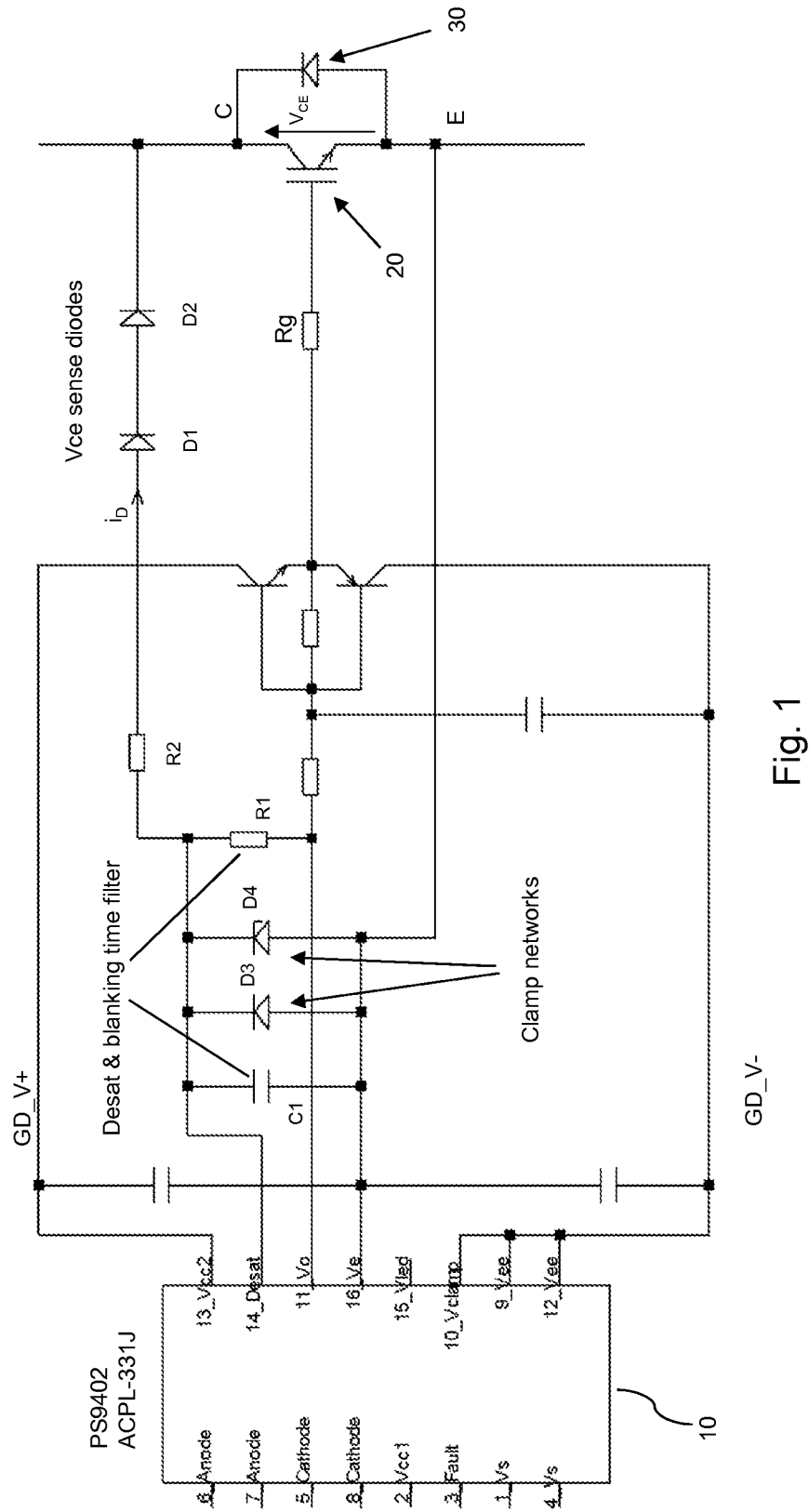
FIG. 1 shows a known desaturation protection circuit for an optocoupler.
Figure 2:
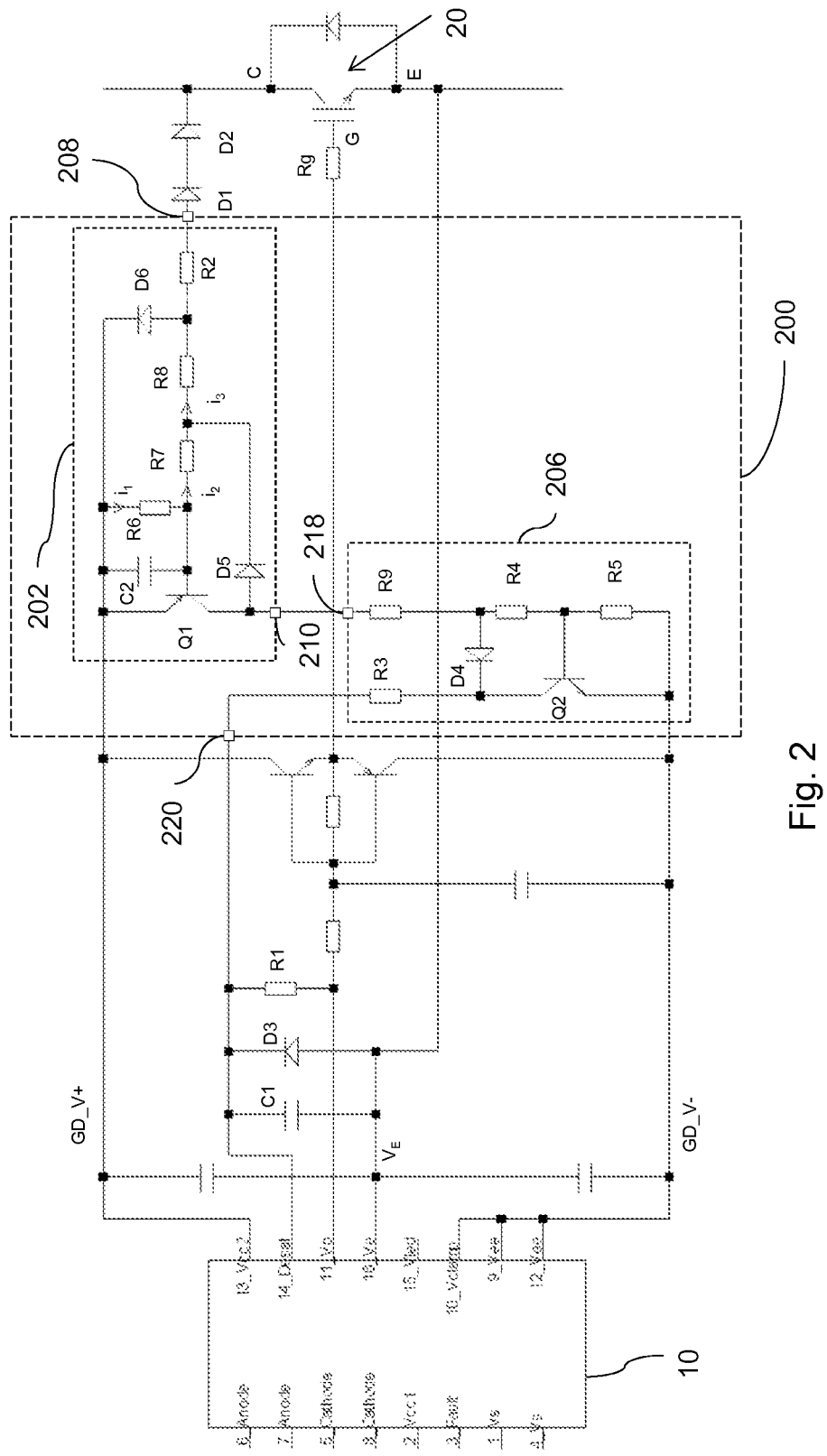
FIG. 2 shows an embodiment according to the present disclosure.

FIG. 2 shows an embodiment of a circuit including an improved Vce sensing interface circuit 200. D1 and D2 form the Vce sense diode string (DESAT diodes) which, instead of connecting directly to the Desat input of the IC 10 via R2 (as shown in FIG. 1), connects via a desaturation detection circuit 200. The desaturation detection circuit 200 lies between the desaturation detection input of an optocoupler 10 and the collector of a power transistor 20 (e.g. an IGBT) having a collector C, an emitter E and a gate G. The collector connects to the load to be driven e.g. a motor load or brake chopper resistor.

The desaturation detection circuit 200 comprises a threshold setting element 202 and a detector element 206. The threshold setting element 202 has an input 208 and an output 210. The input 208 is for connection to the output of a power transistor 20 (e.g. the collector of an IGBT) via the Vce sense diodes D1 and D2. The threshold setting element 202 sets the voltage at the input 208 at which the desaturation detection circuit 200 will provide an output control signal for provision to the desaturation detection input of the IC 10 to trigger a desaturation routine. The threshold setting element 202 provides an output at the output 210 of the threshold setting element 202 when the input voltage is exceeded.

The detector element 206 has an input 218 connected to the output 210 of the threshold setting element 202 and an output 220 connectable to the desaturation detection input of an optocoupler 10. The detector element 206 is arranged to detect an output at the output 210 of the threshold setting element 202 and to provide an output voltage at the output 220 of the detector for the desaturation detection input of the optocoupler 10 to trigger a desaturation routine. The threshold setting element 202 is therefore arranged to determine whether one or more conditions for normal operation are complied with and to generate an output to the detector 206 in the event that one or more of the conditions for normal operation are not complied with.

The threshold setting element 202 comprises a switching element Q1 (e.g. a bipolar transistor). In this case, the base of the switch Q1 is connected to the input 208 of the desaturation detection circuit (and hence the Vice sense diode string (D1 and D2)) via a resistor network comprising resistors R2, R6, R7 and R8. The detector element 206 comprises a switching element Q2 (e.g. a bipolar transistor). In this case, the collector of the switch Q2 is connected to the output 220 of the desaturation detection circuit 200 via a-resistor R3.

The collector of switch Q1 connects to the base of switch Q2 via the resistor network comprising resistors R4, R5 and R9. Switch Q1 will switch on or off depending on the voltage level at the collector of the IGBT. When the IGBT is normally on and saturated, Q1 and Q2 will also be switched on, with the collector of Q2 (output 220 of the desaturation detection circuit 200) controlling the Desat input of the IC (pin 14) via R3, holding it at a level just below $V_E$, the common voltage for the IC. Q2 will be switched into the off-state when the IGBT is in either the normal off-state or when it is out of saturation and in desaturation.

The threshold level for the threshold setting element 202 to change state is determined by resistors R2, R6, R7 and R8, although the principal adjustment is through variation of R8. With similarity to the conventional circuit shown in FIG. 1, R2 may be chosen to be in the region of 100Ω. Typical values for R6, R7 and R8 might be in the region of 820Ω, 470Ω and 5k6Ω respectively.

It is to be noted that resistor R2 may be integral with the desaturation detection circuit 200 (as shown) or may be a separate component outside the desaturation detection circuit 200.

Q1 is prevented from saturated switching by the incorporation of components D5, R7 and Q2 is prevented from saturated switching by the incorporation of components D4, R4, thus enabling the switches Q1, Q2 to turn off quickly when an IGBT desaturation condition is detected. Capacitor C2, connected across Q1 base-emitter, acts as a noise filter against disturbances from the inverter power circuit. Diode D6 with its anode connected to the GD_V+ rail shunts reverse recovery current transients arising from D1 and D2 away from the detection circuit.

Resistors R4, R5 and R9 are chosen to provide sufficient base current to control Q2 when Q1 switches on, and to provide anti-saturation conditions to ensure that Q2 turns off quickly when Q1 turns off. The value of R3 is chosen to hold the Desat pin of the IC at just below $V_E$ with D3 in conduction when $V_O$ is in the output high state and Q2 is on. R3 will depend upon the value chosen for R1 which in turn sets the blanking time in conjunction with C1.

The operation of the desaturation detection circuit 200 shown in FIG. 2 will now be described further.

Starting in the off-state for the gate drive circuit, the $V_O$ pin of the IC (pin 11) is in the low state and is held close to $V_{EE}$ potential, typically this will be between −5 and −10V with respect to $V_E$ depending on the GD_V− voltage rail. The gate G of the IGBT will also be at this potential holding the power module off. The Desat input of the IC (pin 14) will be held slightly below $V_E$ by the forward volt drop of diode D3, and if semiconductor voltage drops are ignored then the approximate current through the diode D3 is given by:

$$i_{D3} \approx \frac{V_{EE} - V_E}{R1} \quad (4)$$

With the IGBT gate emitter reverse biased, DESAT diodes D1 and D2 will be also be reverse biased and blocking the DC bus voltage across the inverter power circuit. Transistor switches Q1 and Q2 will also be in the off-state.

To switch on the IGBT, the $V_O$ pin goes high once the optocoupler LED has become forward biased. The voltage between the Desat pin (pin 14) and $V_E$ (pin 16) rises according to the blanking time constant defined by R1 and C1, which is set so that the voltage does not exceed the internally set threshold level of the IC before the IGBT has properly turned on. Within the blanking time, IGBT collector-emitter voltage Vice falls to a low level and both Q1 and Q2 switch on keeping the Desat pin at just below the $V_E$ potential.

The IGBT collector-emitter voltage is sensed by D1 and D2 in the same way as the conventional design. When the IGBT is in a saturated state within the normal range, the base-emitter of Q1 will be forward biased allowing its collector to be pulled up close to GD_V+ rail. The base emitter of Q2 will also become forward biased via resistors R4, R5 and R9, so that Q2 collector is close to the GD_V− rail, hence current will flow through R3 and D3, holding the Desat input just below $V_E$ potential.

The Desat pin may be pulled slightly negative but the voltage should be kept within the manufacturer's recommended limits, typically a schottky diode would be selected for D3.

In a typical design, the current through R3 should slightly exceed the current through R1 when the $V_O$ pin is in the output high state, i.e. $V_{OH}$, and Q2 is on. Neglecting semiconductor voltage drops, R3 may be calculated:

$$i_{R3} > \frac{V_{OH}}{R1} \quad (5)$$

$$R_3 \approx \frac{V_{EE} - V_E}{i_{R3}} \quad (6)$$

It would be possible in a variation of the design for Q2 emitter and the $V_{EE}$ node of R5 to be connected to $V_E$ rather than $V_{EE}$. The voltage potential at the Desat pin would be then controlled by the relative values of R1 and R3 when $V_O$ is high.

The values of R1 and R3 may be chosen so that under normal operation when Q2 is on and $V_O$ is in the output high state, the voltage at the Desat pin of the IC is set to be below the minimum desat voltage of the IC. The output of the detector element 206 is therefore held below a level that causes triggering of a desaturation routine in the IC until Vice rises above the threshold voltage level set by threshold setting element 202. For instance, in a further variation of the design, the values of R1 and R3 could be chosen so that under normal operation when Q2 is on and $V_O$ is the output high state, the voltage at the Desat pin of the IC is set to be midway between the minimum desat voltage of the IC (e.g., 6V) and $V_E$. The scope to do this will depend on the voltage tolerance of supply rails GD_V+ and GD_V−. This approach could lead to a faster response time to initiate a soft turn-off.

When the IGBT is pulled out of saturation due to a short circuit fault and into desaturation, Q1 and Q2 turn off quickly, which then allows the Desat input (pin 14) of the IC to charge to its internally set threshold trip level via R1 and a soft turn-off is then initiated by the IC.

Q1 and Q2 are controlled by the state of the IGBT collector and will therefore normally be on when the Vce is below the threshold set by the threshold setting circuit 202 so holding the Desat input at slightly below the $V_E$ potential.

Q1 is set to turn off at the voltage level at which the desaturation detection circuit 200 is set to trigger. This turns off Q2 and generates a control signal at the output 220 of the desaturation detection circuit 200 that causes the input to the desaturation input (pin 14) of the IC 10 to rise to the internally fixed threshold level for the DESAT input.

IGBT Trip Level for the Vce Sense Circuit

With reference to FIG. 2, the voltage across the collector-emitter of the IGBT that causes the sensing circuit to change state ($V_{CE\_TRIP\_LEVEL}$) may be calculated from the following analysis. As the collector-emitter voltage across the IGBT increases with rising fault current, the current through anti-saturation diode D5 eventually falls to zero, and the current i3 through R8 and the sense diodes D1 and D2 equals the current $i_2$, through R7.

Applying Kirchhoff's Voltage Law around the circuit loop formed by the IGBT, Vce sense circuit 200 and the GD_V+ supply rail with respect to the IGBT emitter:

$$V_{CE\_TRIP\_LEVEL} = V_{GD\_V+} - (V_{BE\_Q1} + i_2(R7+R8+R2) + V_{D1}+V_{D2}) \quad (7)$$

Assuming that the current gain of Q1 is high, the base current of Q1 may be considered small compared to $i_1$, and the current through R6 is:

$$i_2 \approx \frac{V_{BE\_Q1}}{R6} \quad (8)$$

Substituting equation 8 into equation 7, $$V_{CE\_TRIP\_LEVEL} = \quad (9)$$
$$V_{GD\_V+} - \left(V_{BE\_Q1} + \frac{V_{BE\_Q1}}{R6}(R7 + R8 + R2) + V_{D1} + V_{D2}\right)$$

From equation 9, the Vce trip level can be readily calculated. In a typical design, allowing for variations in the base emitter voltage of Q1, the trip level will typically be in the range from 7 to 10V for a given set of resistor values.

The trip level of the Vce sense circuit 200 can therefore be set independently of the gate drive optocoupler's Desat threshold level which is internally fixed within the chip. The headroom against the normal operating saturation voltage of the IGBT can be therefore be designed to be relatively high, thereby minimizing the risk of nuisance tripping of the circuit.

Because the Vce sense diodes are not directly connected to the gate drive optocoupler, the likelihood of the Desat input of the optocoupler being transiently pulled below ground ($V_E$ potential) is reduced, thus avoiding a malfunction of the IC. The circuit also avoids the need for clamping networks to protect the Desat input of the optocoupler from power circuit switching transients and other noise disturbances. An example of clamping networks that may be required in a conventional design is shown in FIG. 1 (D3 and D4).

The Vce sense interface acts upon the Desat input of the gate drive optocoupler which in turn provides a local soft turn-off signal to the IGBT which the gate drive circuit is controlling.

The technique described herein aims to provide an electrically robust Vce sense interface to an IGBT gate drive optocoupler IC which has a desaturation detect input and soft turn-off capability.

It is achieved by controlling the 'Desat' input of the IC indirectly from the DESAT (Vce sense) diodes that sense the out-of-saturation condition. In addition, the circuit provides a Vce detection level that can be adjusted independently of the IC and which will therefore give adequate design headroom against nuisance tripping. The application is primarily intended for use in industrial inverters and brake chopper circuits which use IGBT power modules in the current and voltage ranges of 150 to 1000 A, and 600 to 1700V respectively.

The desaturation detection circuit 200 detects the rise in collector-emitter voltage and activates the Desat input of the IC which then slowly reduces the gate-emitter voltage to the IGBT. The slow turn-off avoids excessive overvoltage spikes from developing across the collector emitter and damaging the IGBT. By contrast, a normal speed turn-off under fault conditions would result in a very high collector emitter overvoltage across the IGBT because of the stray inductances in the power circuit and high rate of fall of collector current.

The desaturation detection circuit 200 holds the input to the desaturation detection input of the IC (pin 14) well below the internally set threshold level for the desat pin (e.g. at the common voltage $V_E$) until the collector-emitter voltage of the insulated gate bipolar transistor reaches a predetermined desaturation voltage higher than the voltage at which the desaturation detection input of the IC would trigger a desaturation routine.

The desaturation detection circuit 200 maintains the output to the desaturation input of the IC below the desaturation detection voltage of the optocoupler during desaturation operation of the insulated gate bipolar transistor until the collector-emitter voltage of the insulated gate bipolar transistor reaches a predetermined desaturation state and then when the collector-emitter voltage of the insulated gate bipolar transistor reaches the predetermined desaturation state the desaturation detection circuit 200 allows the voltage to the desaturation input of the IC to increase to the internally set threshold level for the desat pin (pin 14) to trigger desaturation detection by the IC.

When compared to the conventional design implementations, this offers an electrically robust solution for a Vce sense interface circuit for use with gate drive optocoupler ICs which have soft turn-off capability.

The technique described aims to minimize the risk of nuisance tripping of inverter and brake chopper protection circuits, and offers enhanced field reliability to the end user.

In the following the desaturation detection circuit connects to the collector of an IGBT via one or more Vce sense diodes. The described desaturation detection circuit may be used between the desaturation detection input of an optocoupler and the collector of an insulated gate bipolar transistor having a collector, an emitter and a gate. The desaturation detection circuit may comprise a first switching element to be coupled (via one or more Vce sense diode(s)) to the collector of the insulated gate bipolar transistor via a first resistor network and a second switching element to be coupled to the desaturation detection input of the optocoupler via a second resistor network, the first switching element being connected to the second switching element, the first switching element being arranged to turn on when the insulated gate bipolar transistor is on and operating in normal operation and to turn on the second switching element and the first switching element being arranged to turn off when the insulated gate bipolar transistor is on and operating in a desaturated state when the voltage of the collector of the insulated gate bipolar transistor reaches a threshold level above the desaturation voltage of the insulated gate bipolar transistor, the threshold level being set by the first switching device and to turn off the second switching element.

The disclosure has been described with reference to an optocoupler integrated circuit (IC) which has a desaturation detect input and soft turn-off capability. However it is applicable to any isolated drive which has a desaturation detect input and optionally a soft turn-off capability. Additionally the disclosure has been described with reference to an IGBT but may also be applicable to other power switching devices such as power MOSFETs.

The invention claimed is:

1. A desaturation detection circuit for use between a desaturation detection input of an optocoupler and an output of a power switching device, the desaturation detection circuit comprising:
a threshold setting element having an input and an output, the input for connection to the output of a power switching device via one or more diode(s), the threshold setting element being arranged to set a threshold voltage at the input at which the threshold setting element will provide an output at the output of the threshold setting element when an input voltage is exceeded, the threshold setting element including a first switching element arranged to be in an on state during desaturation operation of the power switching device until the output of the power switching device reaches the threshold voltage, and
a detector having an input connected to the output of the threshold setting element and an output connectable to a desaturation detection input of an optocoupler, the detector being arranged to detect an output at the output of the threshold setting element and in response to provide a control signal at the output of the detector for the desaturation detection input to trigger a desaturation routine in the optocoupler, the detector including a second switching element arranged to be in an off state when the threshold setting element provides an output and arranged to provide the control signal when an output from the threshold setting element is provided.

2. A circuit according to claim 1 wherein the output of the detector is held below a level at which a desaturation routine in the optocoupler would be triggered until an output from the threshold setting element is detected.

3. A circuit according to claim 1 wherein the output of the detector is held at substantially a common voltage of the circuit until an output from the threshold setting element is detected.

4. A circuit according to claim 1 wherein the output of the detector is held midway between a common voltage and a level at which a desaturation routine in the optocoupler would be triggered until an output from the threshold setting element is detected.

5. A circuit according to claim 1 further comprising a first resistor network to couple the first switching element to the output of the power switching device via at least one diode and a second resistor network to couple the second switching element to the optocoupler, the first and second switching elements holding the voltage at the output of the desaturation detection circuit at a voltage below the desaturation detection input of the optocoupler until the voltage of the output of the power switching device reaches the threshold voltage.

6. A circuit according to claim 1 wherein the first switching element and the second switching element are in an on state when the power switching device is operating in normal saturated mode and in an off state when the power switching device is operating out of saturation or is in an off state.

7. A circuit according to claim 1 wherein the power switching device is an insulated gate bipolar transistor having a collector, an emitter and a gate, and wherein the input of the threshold setting element is for connection to the collector of the insulated gate bipolar transistor via at least one diode.

8. A circuit comprising:
a power switching device,
an optocoupler having a desaturation detection input to detect desaturation and an output, the output coupled to the power switching device to provide a control signal to the power switching device; and
a desaturation detection circuit as claimed in claim 1.

9. A circuit according to claim 8 wherein the power switching device is an insulated gate bipolar transistor having a collector, an emitter and a gate, and wherein the input of the threshold setting element of the desaturation detection circuit is connected via at least one diode to the collector of the insulated gate bipolar transistor and the output of the optocoupler is connected to the gate of the insulated gate bipolar transistor.

10. A method of operating a desaturation detection circuit for use between a desaturation detection input of an optocoupler and an output of a power switching device, the desaturation detection circuit including a threshold setting element having an input for connection to the output of the power switching device and an output, and a detector having an input connected to the output of the threshold setting element and an output connectable to the desaturation detection input of the optocoupler, the method comprising:
monitoring the voltage input to the desaturation detection circuit,
determining whether a voltage input to the desaturation detection circuit is greater than or equal to a threshold voltage set by the threshold setting element, the threshold voltage above a desaturation voltage, and
when the voltage input to the desaturation detection circuit is greater than or equal to the threshold voltage above a desaturation voltage, outputting from the detector a control signal to trigger a desaturation routine in the optocoupler,
wherein the threshold setting element includes a first switching element arranged to be in an on state during desaturation operation of the power switching device until the output of the power switching device reaches the threshold voltage and wherein the detector includes a second switching element arranged to be in an off state when the threshold setting element provides an output and arranged to provide the control signal when an output from the threshold setting element is provided.

11. A method according to claim 10 further comprising holding the output of the desaturation detection circuit below a level at which a desaturation routine in the optocoupler would be triggered until the control signal is outputted.

12. A method according to claim 10 further comprising holding the output of the desaturation detection circuit at substantially a common voltage of the circuit until the control signal is outputted.

13. A method according to claim 10 further comprising holding the output of the desaturation detection circuit midway between a common voltage and a level at which a desaturation routine in the optocoupler would be triggered until the control signal is outputted.

14. A method according to claim 10 wherein the first switching element and the second switching element are in an on state when the power switching device is operating in normal saturated mode and in an off state when the power switching device is operating out of saturation or is in an off state.

15. A circuit according to claim 2 wherein the first switching element and the second switching element are in an on state when the power switching device is operating in normal saturated mode and in an off state when the power switching device is operating out of saturation or is in an off state.

16. A circuit according to claim 15 wherein the power switching device is an insulated gate bipolar transistor having a collector, an emitter and a gate, and wherein the input of the threshold setting element is for connection to the collector of the insulated gate bipolar transistor via at least one diode.

17. A circuit according to claim 15 further comprising a first resistor network to couple the first switching element to the output of the power switching device via at least one diode and a second resistor network to couple the second switching element to the optocoupler.

18. A circuit comprising:
a power switching device,
an optocoupler having a desaturation detection input to detect desaturation and an output, the output coupled to the power switching device to provide a control signal to the power switching device; and
a desaturation detection circuit as claimed in claim 17.

19. A circuit according to claim 3 wherein the first switching element and the second switching element are in an on state when the power switching device is operating in normal saturated mode and in an off state when the power switching device is operating out of saturation or is in an off state.

20. A circuit according to claim 4 wherein the first switching element and the second switching element are in an on state when the power switching device is operating in normal saturated mode and in an off state when the power switching device is operating out of saturation or is in an off state.

\* \* \* \* \*